US009443502B2

(12) United States Patent
Amadu et al.

(10) Patent No.: US 9,443,502 B2
(45) Date of Patent: Sep. 13, 2016

(54) METHOD FOR REDUCING PARASITIC VIBRATIONS OF A LOUDSPEAKER ENVIRONMENT AND ASSOCIATED PROCESSING DEVICE

(71) Applicant: ARKAMYS, Paris (FR)

(72) Inventors: Frederic Amadu, Chelles (FR); Thomas Esnault, Paris (FR); Alexandre Fenieres, Paris (FR)

(73) Assignee: ARKAMYS, Paris (FR)

( * ) Notice: Subject to any disclaimer, the term of this patent is extended or adjusted under 35 U.S.C. 154(b) by 62 days.

(21) Appl. No.: 14/356,093

(22) PCT Filed: Nov. 6, 2012

(86) PCT No.: PCT/EP2012/071948
§ 371 (c)(1),
(2) Date: May 2, 2014

(87) PCT Pub. No.: WO2013/068359
PCT Pub. Date: May 16, 2013

(65) Prior Publication Data

US 2014/0301568 A1 Oct. 9, 2014

(30) Foreign Application Priority Data

Nov. 7, 2011 (FR) ..................................... 11 60116

(51) Int. Cl.

| | |
|---|---|
| ***H03G 3/00*** | (2006.01) |
| ***G10K 11/00*** | (2006.01) |
| ***H04R 3/00*** | (2006.01) |
| *H04R 3/04* | (2006.01) |

(52) U.S. Cl.
CPC ............... *G10K 11/002* (2013.01); *H04R 3/00* (2013.01); *H04R 3/04* (2013.01); *H04R 2430/03* (2013.01)

(58) Field of Classification Search
CPC ..... H04R 3/04; H04R 2430/03; H03G 5/165
USPC .......................................... 381/61, 98–99, 86
See application file for complete search history.

(56) References Cited

U.S. PATENT DOCUMENTS

| | | | | |
|---|---|---|---|---|
| 6,111,960 A | 8/2000 | Aarts et al. | | |
| 8,077,882 B2 * | 12/2011 | Shimura | ................ | H03G 5/165 381/102 |

(Continued)

FOREIGN PATENT DOCUMENTS

| | | | |
|---|---|---|---|
| EP | 1915026 A2 | 4/2008 | |
| JP | 2011082960 A | 4/2011 | |
| WO | 0057673 A1 | 9/2000 | |

*Primary Examiner* — Disler Paul
(74) *Attorney, Agent, or Firm* — Im IP Law PLLC; C. Andrew Im

(57) ABSTRACT

A method for reducing parasitic vibrations of a loudspeaker environment while maintaining the perception of the low frequencies of an original electric sound signal for broadcast after processing by the loudspeaker having a cut-off frequency. A vibration frequency band is identified that causes the loudspeaker to vibrate. A low frequency band of the original sound signal having a frequency close to the cut-off frequency of the loudspeaker is identified as an upper limit. At least one harmonic signal from the isolated low frequency band of the original sound signal is generated. The original sound signal and the harmonic signal are combined to obtain a recombined signal. The vibration frequency band is removed from the recombined signal to obtain a signal for broadcast by the loudspeaker.

6 Claims, 3 Drawing Sheets

(56) References Cited

U.S. PATENT DOCUMENTS

2002/0150255 A1 10/2002 Ohama et al.
2004/0071297 A1* 4/2004 Katou .................. G10H 1/0091 381/61
2008/0175409 A1 7/2008 Lee et al.
2011/0317850 A1 12/2011 Yokoyama
2012/0134504 A1* 5/2012 Napoletano ............ G10K 15/02 381/61

* cited by examiner

METHOD FOR REDUCING PARASITIC VIBRATIONS OF A LOUDSPEAKER ENVIRONMENT AND ASSOCIATED PROCESSING DEVICE

RELATED APPLICATIONS

This application is a §371 application from PCT/EP2012/071948 filed Nov. 6, 2012, which claims priority from French Patent Application No. 11 60116 filed Nov. 7, 2011, each of which is herein incorporated by reference in its entirety.

TECHNICAL FIELD OF THE INVENTION

In the field of vehicle acoustics, the audible and unwanted parasitic vibrations of structures (door panels, waterproofing membranes, dashboard) and miscellaneous objects (cables, screws) that are mechanically and/or acoustically attached to the loudspeakers are called "rattling noise" or "rattle noise". Mechanically and/or acoustically attached items belong to what is called the loudspeaker environment in the remainder of this document.

This phenomenon mainly occurs when the loudspeakers emit low audible frequencies. The noise is similar to rattling in structures or the vibrations of small objects trapped inside the structures. Usually, to reduce said noise, one can:

- mechanically separate the structures and loudspeakers, by inserting vibration mounts, pieces of foam, or spacers,
- mechanically separate the structures from one another, by inserting foam blocks or by reducing the mechanical connections at the junctions,
- changing the mechanical properties of the structures, including their stiffness, mass, and friction, in order to shift the resonance frequencies of some modes
- removing items that vibrate due to their proximity of the loudspeaker's sound field and that may be in contact with surfaces and make noise.

Document US 2002 015255 describes a method called "low compensation", which is applicable to a loudspeaker whose dimensions are too small to reproduce low frequencies. Said method aims to produce a rich low sound without said sound being distorted by the loudspeaker itself.

The invention relates to a method for reducing rattle noise, making it possible to maintain the perception of low frequencies from the broadcast signal and the associated processing device.

The invention has a particularly advantageous application in the domain of sound broadcasting equipment, such as digital televisions, car radios, and MP3 players.

PRIOR ART

When a loudspeaker operates in a certain frequency band that is below its cut-off frequency, objects located in the environment in which it is integrated are likely to start vibrating, which generates sounds that are unpleasant to the ear (the "rattle noise" mentioned above). This frequency band is called "vibration frequency band" in this document. Also, the cut-off frequency of a loudspeaker depends on characteristics that are intrinsic to the loudspeaker.

A known method for avoiding this vibration phenomenon is to remove, in the signal to be broadcasted, the vibration frequency band that is causing the unwanted vibrations. However, the disadvantage of such a method is that it removes the low frequency content of the original work, which modifies how it is perceived by the listener.

PURPOSE OF THE INVENTION

The purpose of the invention is to overcome this disadvantage by proposing a method for reducing or removing parasitic vibrations of a loudspeaker environment while maintaining the perception of the low frequencies of the original sound signal.

As such, prior to removing the vibration frequency band, harmonics from the low frequency portion of the original signal are generated and introduced into the sound signal that can be restored by the loudspeaker. In this manner, the listener will perceive, by sound reconstruction performed by the brain, the sound from the removed low frequency portion.

The invention relates to a method for reducing parasitic vibrations of a loudspeaker environment while maintaining the perception of low frequencies of an electric sound signal, called the original sound signal, intended to be broadcast after processing by said loudspeaker, having a cut-off frequency, characterized in that it comprises the following steps:

- identifying a frequency band that causes the loudspeaker to vibrate, called the vibration frequency band,
- isolating a low frequency band of the original sound signal having a frequency close to the cut-off frequency of the loudspeaker as the upper limit,
- generating at least one harmonic signal from the isolated low frequency band of the original sound signal,
- combining the original sound signal and the harmonic signal to obtain a recombined signal,
- removing the vibration frequency band from the recombined signal (S6) to obtain a signal that can be broadcast by the loudspeaker (HP).

According to one embodiment, the method comprises the step to frequentially offset the lines of the frequency spectrum of the harmonic signal, such that some harmonics located below the cut-off frequency of the loudspeaker are offset beyond said cut-off frequency of the loudspeaker for a broadcast by the loudspeaker.

According to one embodiment, the method comprises the step to compress the dynamic of the low frequency portion of the recombined signal after having removed the vibration frequency band, so as to increase the perceived power of the spectral lines of the recombined signal located around the vibration frequency band.

According to one embodiment, the method comprises the step to generate multiple harmonic signals and to combine the harmonic signals to obtain one signal, called the global harmonic signal, said global harmonic signal being combined with the original sound signal to obtain the recombined signal.

According to one embodiment, the method comprises the step to generate at least one harmonic signal from a harmonic signal that was previously generated from the low frequency band of the original sound signal.

According to one embodiment, to generate the harmonics contained in the harmonic signal, the method comprises the step to remove or temporarily correct the negative portion of the signal from the low frequency band and a step to remove the continuous component thus created.

The invention further relates to a device for processing a sound signal characterized in that it comprises appropriate means for implementing the method according to the invention.

BRIEF DESCRIPTION OF THE DRAWINGS

The invention will be better understood upon reading the following description and studying the drawings that accompany it. These drawings are provided for illustrative purposes only and are not limiting to the invention. They show.

Identical, similar, or analogous elements maintain the same reference number from one drawing to the next.

DESCRIPTION OF EXAMPLE EMBODIMENTS OF THE INVENTION

Figure 1:
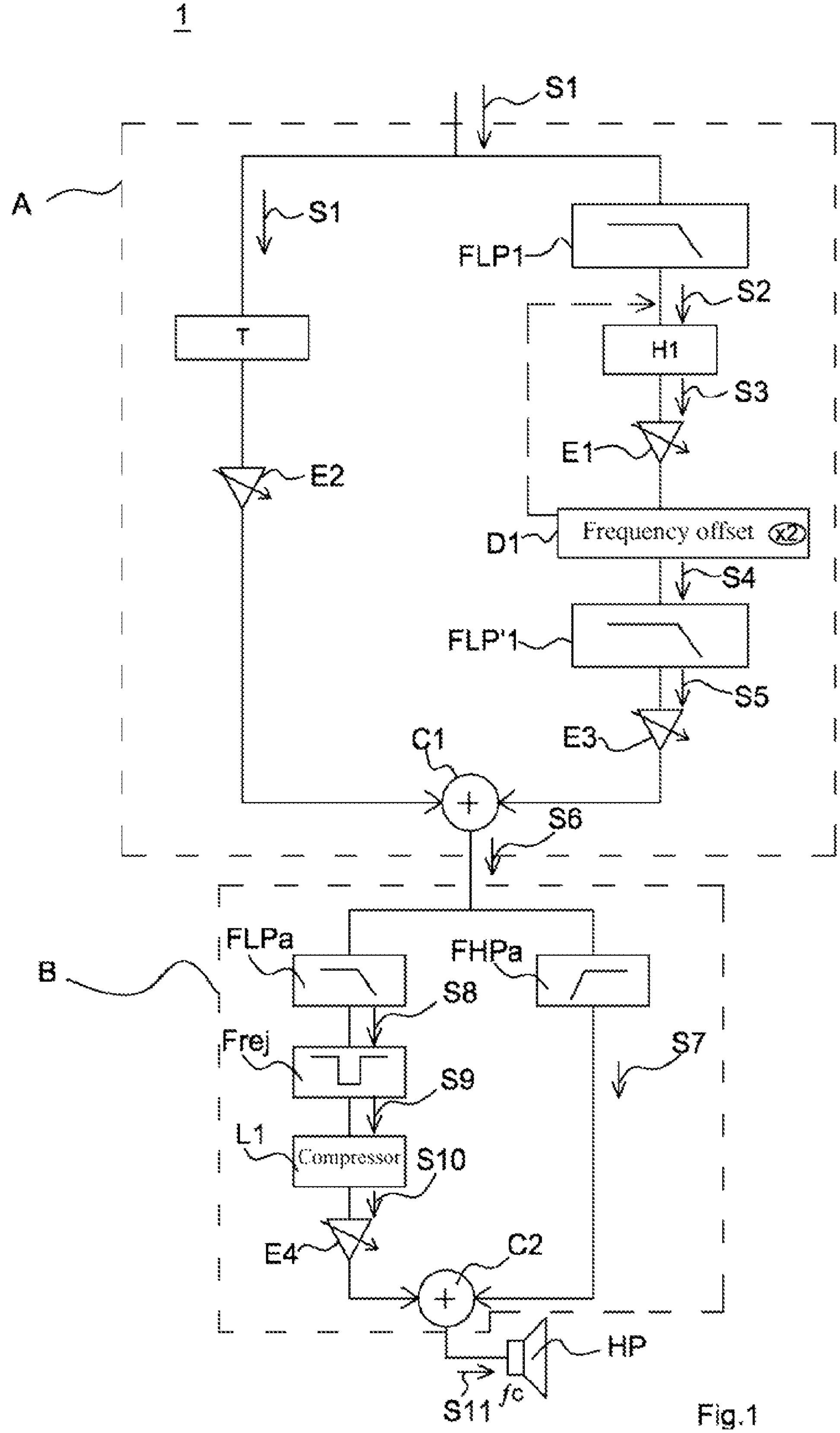
FIG. 1: a schematic representation of the frequency blocks of the processing device according to the invention.

FIG. 1 shows a device 1 carrying out a processing on an electric sound signal, called the original sound signal S1. The device 1 makes it possible to reduce the vibration phenomenon of a loudspeaker environment while maintaining the perception of the low frequencies of the signal S1. Said signal S1 may be, for example, a right or left sound signal of a stereophonic signal. An analog processing is carried out on the other signal of the stereophonic signal. The device 1 may notably be integrated with a digital television, a car radio, or an MP3 player.

As such, the device 1 comprises a set A of functional blocks that ensure the generation and introduction of harmonics within the original signal S1 as well as a set B of blocks that ensure the extraction of the low frequency band of the original sound signal that generates loudspeaker environment vibrations, called a "vibration frequency band". This vibration frequency band is identified by the operator by applying a variable frequency signal to the loudspeaker and identifying the frequency band for which loudspeaker environment vibrations are perceived "by ear". This vibration band is located below the cut-off frequency fc of the loudspeaker.

More specifically, the set A comprises a low-pass filter FLP1 applied to the original signal S1 so as to obtain an original low frequency sound signal S2. In one example, the cut-off frequency of the filter FLP1 is close to the cut-off frequency fc of the loudspeaker HP, which is approximately 100 Hz.

The signal S2 is then applied as input to a module H1 that makes it possible to generate as output a harmonic signal S3. The harmonics contained in the signal S3 are of multiples of the frequencies of the low frequency sound signal S2. In one example, only the row 1 and 2 harmonics are maintained. To generate these harmonics, the module H2 removes, for example, the negative portion of the temporal signal S3 (module H1 being called a "Half Wave rectifier") or corrects the negative portion of the temporal signal S3 (module H2 being called a "Full Wave rectifier"). By "correct", we mean to multiple the negative values of the low frequency sound signal S2 by −1 in a temporal format. Then, the continuous component thus created is removed using a high-pass filter whose cut-off frequency is very low (approximately 20 Hz).

The signal S3 is applied as input to a module D1 that handles the frequency offset of the frequency spectrum lines of the harmonic signal S3, such that some harmonics located below the cut-off frequency fc of the loudspeaker HP are offset beyond said cut-off frequency fc of the loudspeaker. As such, the frequency of each of the spectral lines of the signal S3 is multiplied by an integer N, N preferably being equal to 2. This guarantees that the majority of generated harmonics will be located in the optimal functioning band of the loudspeaker HP. First, the signal S3 will preferably have been equalized using a module E1. By processing the sound, the equalization consists of attenuating or accentuating one or more frequency bands that make up the sound signal.

The offset harmonic signal, referenced as S4 in the drawings, is then filtered by means of a low-pass filter FLP'1 so as to obtain a signal S5, known as the reduced harmonic signal. The filter FLP'1 thus makes it possible to remove the harmonics in the high frequency portion of the signal S4 not used in restoring the low signal. In one example, the cut-off frequency of the low-pass filter FLP'1 is greater than the cut-off frequency of the loudspeaker HP. The cut-off frequency of FLP'1 is between 2*fc and 4*fc, or it is exactly equal to one of these limit values.

After having been delayed by a delay module T and possible equalized by the module E2, the original signal S1 is applied, with the signal S5 preferably equalized by the module E3 as input to a combination device C1. In one example, the combination of signals consists of a sample by sample addition of signals applied as input to device C1. The applied delay T corresponds to the processing time of the signal S1 by the modules FLP1, H1, E1, D1, and FLP'1. Said delay T is, for example, approximately 10 samples.

We get as output from the device C1 a signal S6, called a recombined signal, then processed by the set B, which ensures namely the removal of the vibration frequency band from the sound signal to broadcast.

More specifically, the set B comprises a high-pass filter FHPa and a low-pass filter FLPa applied to the signal S6 so as to obtain a high frequency recombined signal S7 and a low frequency recombined signal, respectively. The cut-off frequencies of the filters FLPa and FHPa are preferably the same. Said cut-off frequencies are chosen close to the cut-off frequency fc of the loudspeaker HP.

Figure 3:
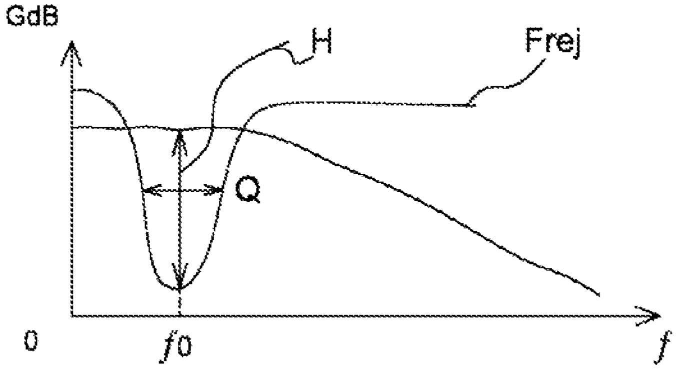
FIG. 3: a schematic representation of the profile of the rejection filter used to extract the vibration frequency band of the sound signal to be broadcasted by the loudspeaker.

A rejection filter Frej is applied to the low frequency recombined frequency S8 so as to remove the vibration frequency band from the signal S8. Said filter Frej, whose profile is shown with dashed lines in FIG. 3, has the following characteristics: a central frequency f0, an attenuation gain H, and a quality coefficient Q corresponding to the width of the cut-off band. Said values are, of course, adjusted based on the amplitude of the vibration frequency band and the width of said vibration frequency band. In one example embodiment, F0=60 Hz, H=−12 dB, Q=5 for a vibration frequency band of approximately 58 to 63 Hz. As a variation, the rejection filer Frej is replaced by a high-pass filter.

The signal S9 obtained as output from the rejection filter Frej is applied as input to a module L1 that can compress the signal S9. The compression of the signal S9 consists of reducing the dynamic of the low frequency signal, containing the generated harmonics, so as to increase the perceived power. As such, the harmonics situated around the vibration frequency band are increased. In one example embodiment, the dynamic of the low frequency signal is compressed at 12 dB.

The compressed signal S10 obtained as output from the module L1 and the high frequency recombined signal S7 are applied as input to a combination module C2, such as a summing mechanism. Prior to its application as input to module C2, the signal S10 is preferably equalized using a module E4. In one example, the combination of signals carried out by the module C2 consists of, as in module C1, adding sample by sample of signals applied as input to the device C2. The sound signal S11 obtained as output from module C2 is a sound signal applied as input to the loudspeaker HP for its broadcast.

The harmonics obtained from the low frequency portion of the signal S1 and introduced into the sound signal will allow the listener to perceive the low frequency sounds of the original sound signal, despite the removal of a portion of said sounds (the vibration frequency band), all while preventing vibration in the environment of the loudspeaker HP.

As a variant, the frequency offset module D1 can be positioned upstream of the harmonic generation module, as shown by the pointed arrow.

Figure 2:
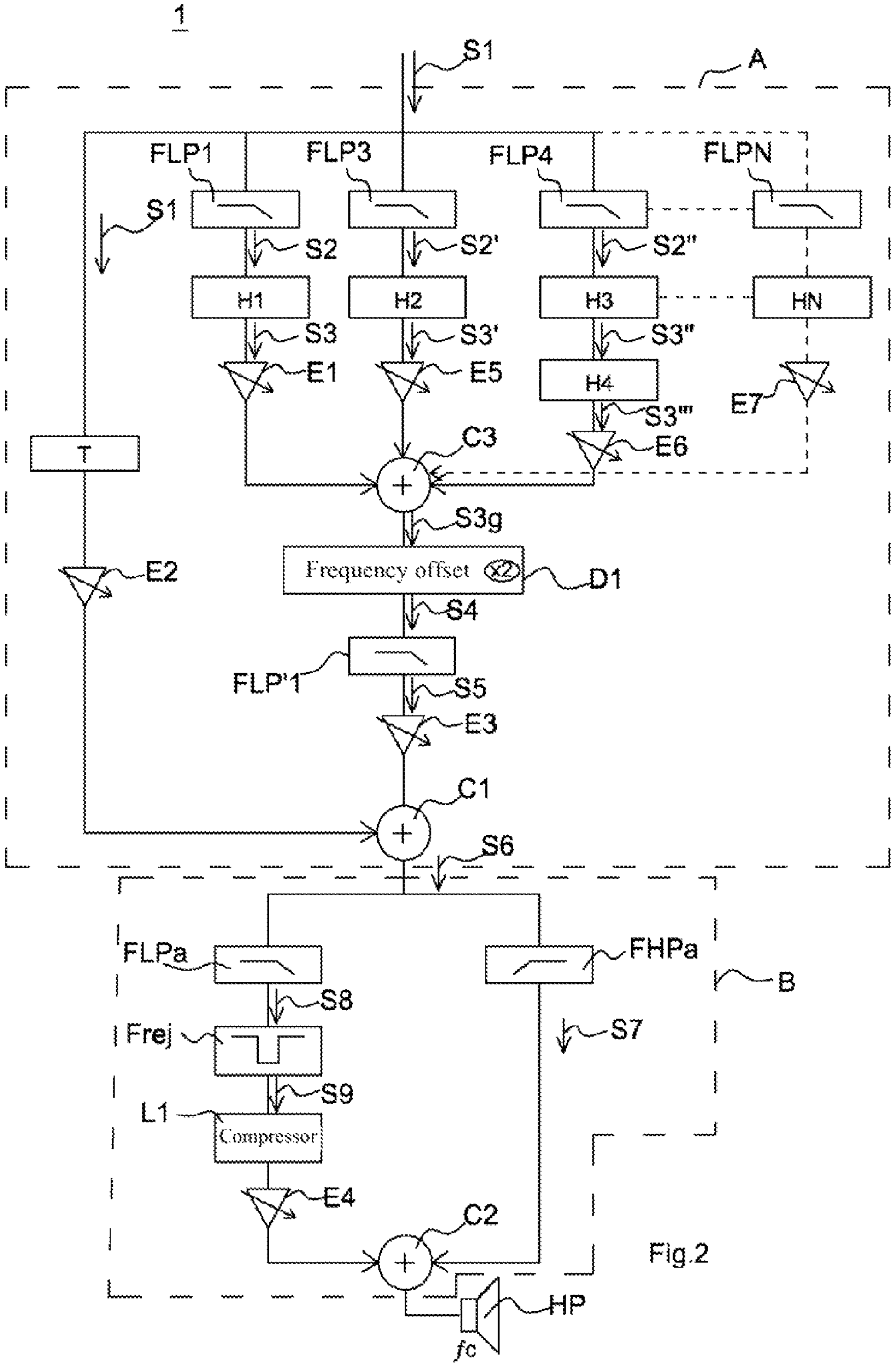
FIG. 2: a schematic representation of the frequency blocks of a variant embodiment of the processing device according to the invention from which several harmonic types are generated.

FIG. 2 shows an embodiment of the processing device according to which several types of harmonics are generated.

As such, several modules H1-HN associated with low pass filters FLP1-FLPN are connected by a parallel or a serial connection to one another. The signals from the low-pass filters FLP1-FLP4 are referenced S2, S2', S2", and S2''', respectively. The harmonic signals obtained as output from the modules H1-H4 are referenced S3, S3', S3", and S3''', respectively.

In the case of two harmonic general systems H3 and H4 connected to one another by a serial connection, the harmonic signal S3''' of the module H4 connected downstream is obtained from the harmonic signal S" generated by the module H3 that is connected upstream.

If multiple harmonic generation systems H1-HN are used, the modules H1-HN preferably implement various harmonic generation methods, or at the very least, for the same method, different adjustment parameters from one another.

The signals S3, S3', S3", and S3''' from the harmonic generation systems H1-H4 are applied as input to a signal combination device C3, such as a summing mechanism that carries out the addition operations exactly like the those of the summing mechanisms C1 and C2. Preferably, the signals S3, S3', S3", S3''' obtained as output from the harmonic generation systems H1-HN, are also equalized using the modules E1, E5, E6, and E7 prior to their application as input to the combination device C3. A signal S3*g*, known as the global harmonic signal, is obtained as output from the device C3.

The subsequent processing steps carried out on the signal S3*g*, which is obtained as output from the combination device C3 are identical to the processing steps carried out on the signal S3 issued from the module H1 in FIG. 1. In other words, apart from the increase in the number of harmonic generation modules H1-HN, the rest of the device 1 remains unchanged relative to what is shown in FIG. 1.

The invention claimed is:

1. A method for reducing parasitic vibrations of a loudspeaker environment while maintaining a perception of low frequencies of an original electric sound signal for broadcast after processing by a loudspeaker having a cut-off frequency comprising the steps of:

identifying a vibration frequency band that causes the loudspeaker to vibrate;

isolating a low frequency band of the original sound signal having a frequency close to the cut-off frequency of the loudspeaker as an upper limit;

generating at least one harmonic signal from the isolated low frequency band of the original sound signal;

combining the original sound signal and said at least one harmonic signal to obtain a recombined signal;

removing the vibration frequency band from the recombined signal to obtain a signal for broadcast by the loudspeaker; and compressing a dynamic of a low frequency portion of the recombined signal with the vibration frequency band removed there from to increase a perceived power of spectral lines of the recombined signal located around the vibration frequency band.

2. The method according to claim 1, further comprising the step of frequentially offsetting lines of a frequency spectrum of said at least one harmonic signal such that some harmonics located below the cut-off frequency of the loudspeaker are offset beyond the cut-off frequency of the loudspeaker for broadcast by the loudspeaker.

3. The method according to claim 1, further comprising the steps of generating multiple harmonic signals and combining the harmonic signals to obtain one global harmonic signal to be combined with the original sound signal to obtain the recombined signal.

4. The method according to claim 3, further comprising the step of generating at least one harmonic signal from a harmonic signal that was previously generated from the low frequency band of the original sound signal.

5. The method according to claim 3, further comprising the step of generating harmonics contained in a harmonic signal by removing or temporarily correcting a negative portion of the harmonic signal from the low frequency band and removing a continuous component created there from.

6. A device for processing an original sound signal to reduce parasitic vibrations of a loudspeaker environment while maintaining a perception of low frequencies of the original sound signal for broadcast after processing by a loudspeaker having a cut-off frequency, comprising:

a signal generator to generate a variable frequency signal to identify a vibration frequency band that causes the loudspeaker to vibrate;

a low-pass filter to isolate a low frequency band of the original sound signal having a frequency close to the cut-off frequency of the loudspeaker as an upper limit;

a half wave rectifier to generate at least one harmonic signal from the isolated low frequency band of the original sound signal;

a combination device to combine the original sound signal and said at least one harmonic signal to obtain a recombined signal;

a rejection filter to remove the vibration frequency band from the recombined signal to obtain a signal for broadcast by the loudspeaker; and a compressor to compress a dynamic of a low frequency portion of the recombined signal with the vibration frequency band removed there from to increase a perceived power of spectral lines of the recombined signal located around the vibration frequency band.

* * * * *